United States Patent [19]

Toshiaki et al.

[11] Patent Number: 5,555,212

[45] Date of Patent: Sep. 10, 1996

[54] METHOD AND APPARATUS FOR REDUNDANCY WORD LINE REPLACEMENT IN A SEMICONDUCTOR MEMORY DEVICE

[75] Inventors: Kirihata Toshiaki, Wappingers Falls; Kato Daisuke, Poughkeepsie, both of N.Y.

[73] Assignees: Kabushiki Kaisha Toshiba, Kawasaki, Japan; International Business Machines Corporation, Armonk, N.Y.

[21] Appl. No.: 306,438

[22] Filed: Sep. 19, 1994

[51] Int. Cl.$^6$ .............................. G11C 7/00; G11C 29/00
[52] U.S. Cl. .......................... 365/200; 365/201; 365/149; 371/10.3
[58] Field of Search ..................................... 365/200, 201, 365/149, 225.7; 371/10.1, 10.2, 10.3

[56] References Cited

U.S. PATENT DOCUMENTS

| | | | |
|---|---|---|---|
| 4,656,610 | 4/1987 | Yoshida et al. | 365/200 |
| 4,866,676 | 9/1989 | Crisp et al. | 365/200 |
| 4,918,662 | 4/1990 | Kondo | 365/210 |
| 5,021,944 | 6/1991 | Sasaki et al. | 365/200 |
| 5,083,294 | 1/1992 | Okajima | 365/200 |
| 5,136,543 | 8/1992 | Matsuda et al. | 365/190 |
| 5,218,572 | 6/1993 | Lee et al. | 365/200 |
| 5,267,204 | 11/1993 | Ashmore, Jr. | 365/200 |
| 5,289,417 | 2/1994 | Ooishi et al. | 365/200 |
| 5,424,898 | 6/1995 | Hagiwara et al. | 365/201 |

OTHER PUBLICATIONS

"A 50–ns 16–Mb DRAM with a 10–ns Data Rate and On–Chip ECC," Kalter, Howard L., et al., *IEEE Journal of Solid–State Circuits*, vol. 25, No. 5, pp. 1118–1128 (Oct. 1990).

*Primary Examiner*—David C. Nelms
*Assistant Examiner*—Huan Hoang
*Attorney, Agent, or Firm*—Banner & Allegretti, Ltd.

[57] ABSTRACT

A method and apparatus for redundancy word line replacement in a semiconductor device involves generating a control signal which causes the data on the data lines to be flipped when the bit pattern of the memory cells coupled to a redundant word line are complementary to the bit pattern of the memory cells of a defective word line which is being replaced by the redundant word line. During both read and write operations, a data flip control signal is input to a data flip circuit to control the state of the bit information.

32 Claims, 12 Drawing Sheets

- T-CELL (NO DL FLIP)
- T-CELL (DL FLIP)

FIG. 10c

| MODE | A0 | A1 | $\overline{WD}$ | $\overline{RDWDj}$ | $\overline{RDWDk}$ | $\overline{DFS}$ |
|---|---|---|---|---|---|---|
| NOR. | L | L | L | H | H | H |
| NOR. | L | H | L | H | H | L |
| NOR. | H | L | L | H | H | L |
| NOR. | H | H | L | H | H | H |
| RED. | - | - | H | L | H | H |
| RED. | - | - | H | H | L | L |

METHOD AND APPARATUS FOR REDUNDANCY WORD LINE REPLACEMENT IN A SEMICONDUCTOR MEMORY DEVICE

FIELD OF INVENTION

The present invention generally relates to a semiconductor memory device and, more particularly, to a method and apparatus for replacing defective memory cells in a semiconductor memory device using redundant memory cells.

BACKGROUND OF INVENTION

Typically, a semiconductor memory cell array includes a plurality of memory cells MC arranged in rows and columns and has a plurality of word lines $WL_1$, $WL_2$, ..., and $WL_n$ which intersect bit line pairs $BL_1$, $\overline{BL_1}$, $BL_2$, $\overline{BL_2}$, ..., and $BL_m$, $\overline{BL_m}$. A conventional arrangement is depicted in FIG. 1. Memory cells are located at intersections of word lines WL and bit lines of a plurality of bit line pairs. Each memory cell includes a capacitor for storing data and a MOS transistor for switching. A sense amplifier section 2 including a plurality of sense amplifiers is responsive to a column selection signal CSL and transfers data between selected memory cells and a data line pair DL, $\overline{DL}$.

An address buffer (not shown) receives external address signals which are decoded by a row decoder 4 and a column decoder 6. The row decoder 4 supplies a word line selecting signal RSL to a word line driver 8 which drives a word line selected in accordance with the address signals. A column decoder 6 supplies the column selecting signal CSL to the sense amplifier section 2 to effect data transfer between the data lines DL, $\overline{DL}$ and the column selected in accordance with the addressed signals.

FIG. 2 is a detailed depiction of a portion of the arrangement shown in FIG. 1. Referring to FIG. 2, a word line $WL_i$ is connected to a gate of a MOS switching transistor Qs in a memory cell MC1. When the transistor Qs of memory cell MC1 is switched on by a signal on word line WLi, a data signal is transferred between the capacitor Cs of the memory cell MC1 and a bit line $BL_j$ connected to the memory cell MC1. In a reading operation, for example, the bit lines $BL_3$ and $\overline{BL_3}$ of the illustrated bit line pair are precharged to a precharge voltage ½ Vdd (½ Vdd sensing). Similarly, a word line $WL_j$ is connected to a gate of a MOS switching transistor Qs of in a memory cell MC2. When the transistor Qs of memory cell MC2 is switched on by a signal on word line $WL_j$, a data signal is transferred between the capacitor Cs of the memory cell MC2 and a bit line $\overline{BL_j}$ connected to the memory cell MC2. When data stored in one of the memory cells is read onto one of the bit lines, a potential difference is generated between the bit lines $BL_j$ and $\overline{BL_j}$ of the bit line pair. A bit line sense amplifier SA connected to the bit line pair $BL_j$ and $\overline{BL_j}$ senses and amplifies this potential difference. As shown in FIG. 2, sense amplifier SA includes a CMOS flip-flop connected between the bit lines $BL_j$ and $\overline{BL_j}$. The CMOS flip-flop which includes transistors Q1, Q2, Q3, and Q4 is connected via a PMOS transistor Q11 and an NMOS transistor Q12 to a power source Vdd and ground Vss, respectively. The gates of transistors Q11 and Q12 receive trigger signals $\overline{S_0}$ and $S_0$, respectively. A pair of NMOS transistors Q5 and Q6, connected between the bit lines $BL_j$, $\overline{BL_j}$ and the data lines DL, $\overline{DL_j}$ form an input/output (I/O) gate. Responsive to a signal $CSL_j$ supplied from column decoder 6 (FIG. 1) to the I/O gate transistors Q5 and Q6, data signals are transferred between the bit lines $BL_j$, $\overline{BL_j}$ and the data lines DL, $\overline{DL}$ when the column j has been selected.

As the capacity of semiconductor memory devices has increased, the possibility that the devices will contain one or more defective memory cells has also increased. This problem adversely affects the yield of semiconductor memory device manufacturing processes. One technique for dealing with this problem is to utilize redundant memory cells which are provided in a semiconductor memory device to replace memory cells which are determined to be defective during device testing. Accordingly, a word line or a bit line to which a defective memory cell is connected may be replaced by a redundant word line or redundant bit line connected to redundant memory cells. An address of a defective memory cell may be programmed by blowing appropriate ones of the fuses in a redundancy control circuit. A redundant memory cell is selected when an address corresponding to a defective memory cell is input.

FIG. 3 illustrates a portion of a conventional dynamic random access memory with row redundancy. The memory portion includes memory cells MC1, MC2 and a redundant memory cell RMC1. The memory cells MC1 and MC2 are formed by a respective data storage capacitors Cs and transfer transistors Qs. Redundant memory cell RMC1 is formed by a data storage capacitor Cr and a transfer transistor Qr. The gates of the transfer transistors Qs, Qs of memory cells MC1, MC2 are connected to word lines $WL_i$ and $WL_j$, respectively. The gate of the transfer transistor Qr of redundant memory cell RMC1 is connected to a redundant word line $RDWL_i$. External address signals are supplied via an address buffer (not shown) to a row decoder which generates word line selecting signals RSLi, RSLj, ..., etc. The word line selecting signals are supplied to word line driver WDR. The address buffer also forwards address signals to redundancy control circuit RRDN. RRDN generates word line drive signal $\overline{WD}$ and redundant word line drive signals $\overline{RDWD1}$, $\overline{RDWD2}$, ..., $\overline{RDWDj}$. $\overline{WD}$ is active when a memory cell on a normal word line is to be accessed. One of the redundant word line drive signals is active when a redundant memory cell on a redundant word line is to be accessed. The signals $\overline{WD}$ and $\overline{RDWD1}$, $\overline{RDWD2}$, ..., $\overline{RDWDj}$ are forwarded to word line driver WDR and redundant word line driver RWDR, respectively. For each word line, WDR includes an AND gate. At each AND gate $\overline{WD}$ is ANDed with the respective word line selecting signal. When the word line $WL_i$ is driven by word line driver WDR, data may be read out or written to the data storage capacitor Cs of memory cell MC1 via bit line BLj. Similarly, when the word line $WL_j$ is driven by the word line driver WDR, data may be read out or written to the data storage capacitor Cs of the memory cell MC2 via the bit line $\overline{BL_j}$. The redundant memory cell RMC1 may replace either memory cell MC1 or MC2 if it is determined that one of these cells is defective. However, it can be seen that if the redundant memory cell RMC1 replaces the memory cell MC2, the physical data stored in capacitor Cr of redundant memory cell RMC1 for representing a given logical data bit will be inverted with respect to the physical data stored in capacitor Cs of memory cell MC2 for representing the same given logical data bit. In general, in semiconductor memory cell devices such as DRAMs, two logic states correspond to the arrangement and composition of the memory cell array. Half the memory cell array equals the true state of data to be read or written while the other half corresponds to the complementary state.

When a defective memory cell is detected and replaced by a redundant memory cell, the physical data state (i.e., bit pattern) in which a given bit is stored in a substituted redundant memory cell may differ (i.e., be inverted) from the physical data state in which that given bit is stored in the replaced memory cell. To avoid the possibility of a redundant memory cell storing bit information in a physical data state different from the physical data state in which the bit information is stored in the replaced memory cell, redundant memory cells can be substituted in a manner which ensures that the physical data states of the bit information stored in the redundant memory cells and the physical data state of bit information stored in the defective memory cells match. However, the efficiency of the redundancy cell is reduced with such an arrangement.

In light of the above, there is a need to increase redundancy efficiency with a small design space. A single redundancy word line replacement scheme for each defective word line employs a minimum number of elements. One such word line redundancy architecture is depicted in FIG. 4a. Shown in FIG. 4a are a word line driver 20, a memory cell array including a word line $WL_i$, a redundant memory cell array including a redundant word line $RDWL_j$, and a sense amplifier 30. According to this scheme, a redundant word line such as $RDWL_j$ may be substituted for a defective word line $WL_i$. When $RDWL_j$ replaces $WL_i$, the bit information will be inverted because the physical data states of the memory cells respectively coupled to word lines $WL_i$ and $RDWL_j$ are complementary. As a result, this architecture fails to maintain the original physical bit information. Consequently, during testing of the semiconductor memory device, both logical one and logical zero data must be supplied to the memory device in order, for example, to write physical one data to all the memory cells including the redundant memory cells. Likewise, both logical one and logical zero data must be supplied to the memory device in order to write physical zero data to all the memory cells including the redundant memory cells. The testing time for such a scheme is therefore long.

According to another conventional word line redundancy architecture depicted in FIG. 4b having like elements to FIG. 4a, four word lines are simultaneously replaced as a unit and accordingly the physical states of the original bit information is maintained. However, several drawbacks are associated with this structure. For example, the efficiency of the scheme is reduced to ¼ the efficiency of the FIG. 4a scheme using the same number of redundant word lines. To match the efficiency of FIG. 4a, the scheme would require four times the number of redundant word lines. This arrangement may be suitable for low density DRAMs, but as density increases, the number of redundant word lines and disadvantages also increase.

According to the FIG. 4b redundancy architecture, the design space of the original bit increases in excess of 3% (6%) assuming an efficiency of four replaceable cells per 1 mega-bit (512 kilobits) sub-array used for a 256 mega-bit DRAM design. Higher efficiency would be expected for the 1 giga-bit DRAM or larger since the number of sub-arrays would be significantly greater increasing the probability of defective chips. The design space is thereby increased by more than 6% (12%) with an efficiency of 8 replaceable cells per 1 mega-bit (8 per 512 kilo-bits) of memory.

Consequently, there is a need to provide a redundancy architecture for high density semiconductor devices.

SUMMARY OF THE INVENTION

The present invention overcomes the disadvantages associated with the aforementioned schemes. For example, improvements in testing time and redundancy efficiency, and a reduction in design space requirements can be achieved with the present invention.

An illustrative semiconductor device according to the present invention includes memory cells arranged in rows and columns, the memory cells including normal memory cells and redundant memory cells for replacing defective ones of the normal memory cells. Bit line pairs are connected to the memory cells, each bit line pair consists of first and second bit lines which are respectively connected to memory cells in a corresponding one of the columns. The word lines include normal word lines each respectively connected to normal memory cells in a corresponding one of the rows and redundant word lines each respectively connected to redundant memory cells in a corresponding one of the rows. Further, there is included a data line pair consisting of first and second data lines for inputting/outputting complementary data signals to/from the bit line pair. A data flip circuit selectively flips the data signals on the first and second I/O lines.

The semiconductor memory device can further include sense amplifiers each respectively connected to a corresponding one of the bit line pairs for amplifying a potential difference between the first and second bit lines of the respectively corresponding one of the bit line pairs. A data flip decoder generates a data flip control signal, the data flip decoder supplying the data flip control signal to the data flip circuit wherein the data flip circuit flips the data signals according to the data flip control signal. The data flip circuit includes a data input buffer for receiving a data input bit, the data input bit being flipped when the data flip control signal is active during a write operation, and forwarding a representation of the flipped or unflipped data input bit to the first and second data lines. Further, the data flip circuit includes a data output buffer, coupled to the first and second data lines, which receives a data output bit representing bit information on the first and second data lines, the data output bit being flipped when the data flip control signal is active during a read operation, and reading out one of the flipped or unflipped data output bit.

In accordance with the present invention, the design space is minimized and testing times are reduced while maintaining original physical data information. By maintaining the original physical data information, test times can be reduced. For example, test times can be reduced by half for which only physical-one or physical-zero data are tested for an NMOS or PMOS array, respectively. The test time of the signal margin can also be cut in half because the margin of the physical-one or physical-zero data can be tested by applying only a higher or a lower reference voltage to the reference cell or bit line.

BRIEF DESCRIPTION OF THE DRAWINGS

The present invention will now be described in more detail with reference to preferred embodiments of the invention, given only by way of example, and illustrated in the accompanying drawings in which:

FIG. 10c shows a logic table associated with the data flip decoder of the second embodiment of the present invention.

DETAILED DESCRIPTION

The present invention is discussed below with reference to a dynamic random access memory (DRAM). However, the present invention may be applied to other types of semiconductor memory devices. For example, the following invention is particularly developed for a DRAM using half-pitch non-twisting bit lines, but is also applicable to any DRAM or architecture such as twisted bit lines or a quarter pitch layout.

Figure 1:
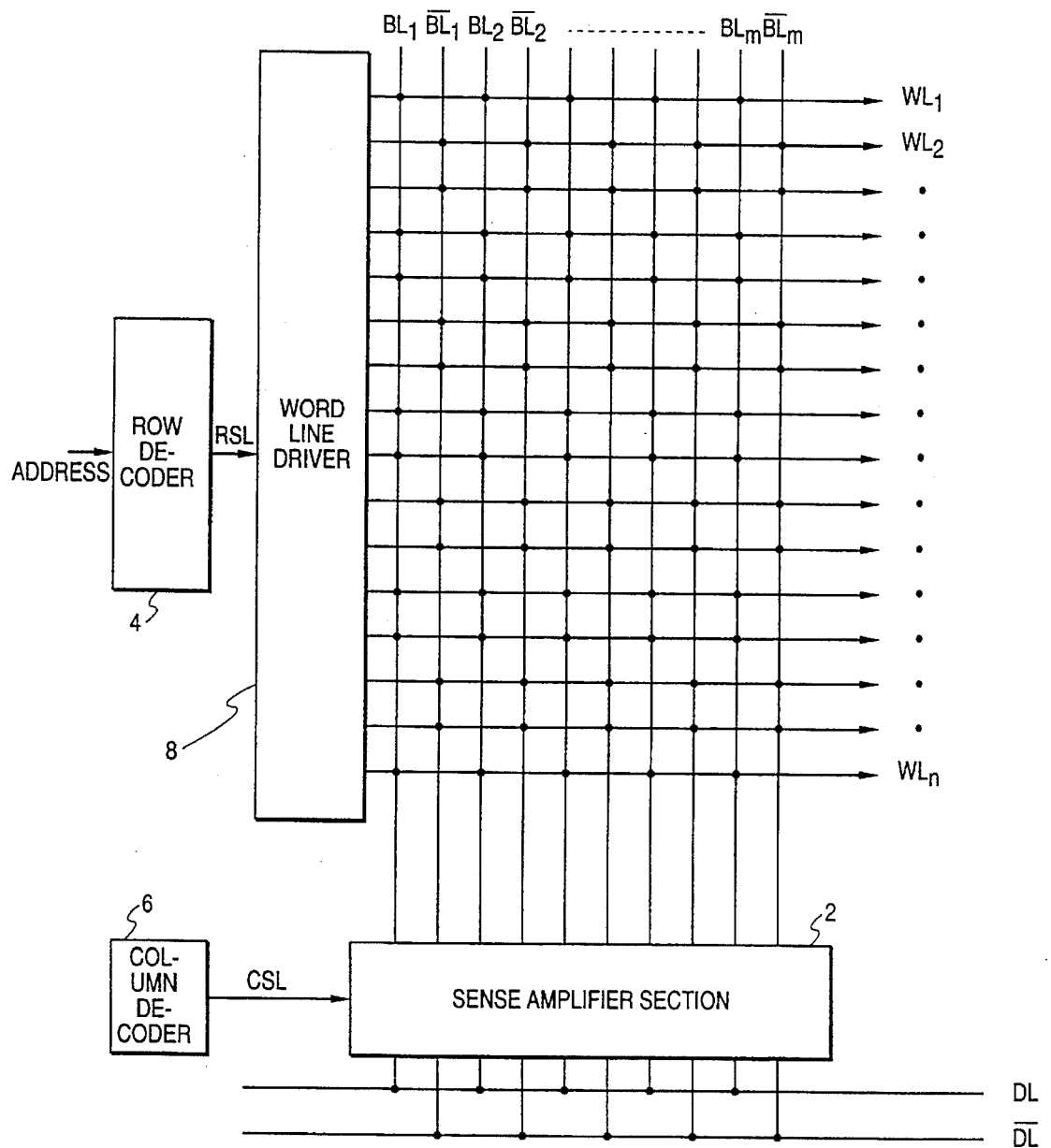
FIG. 1 shows a conventional semiconductor memory architecture.
Figure 2:
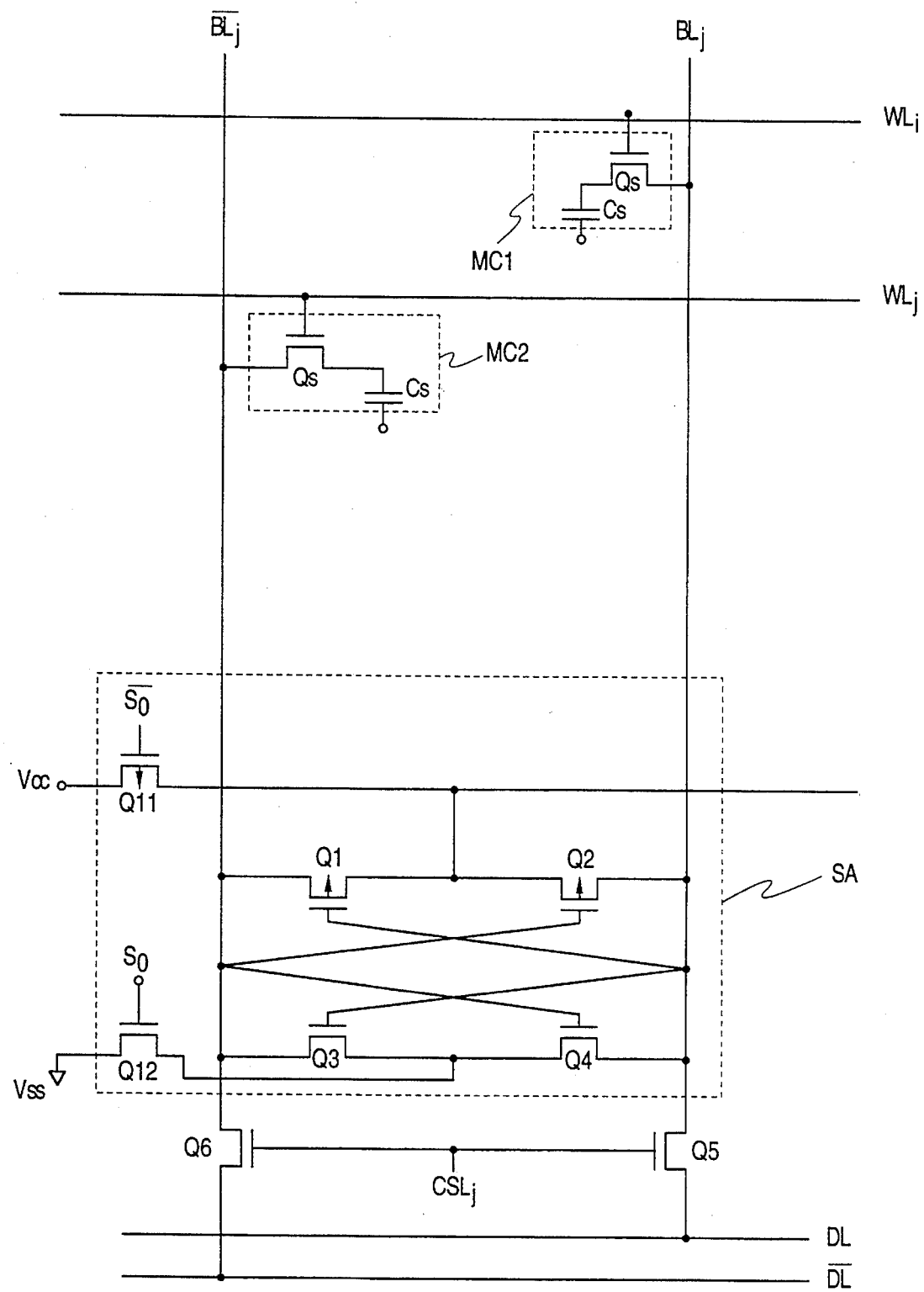
FIG. 2 shows a more detailed conventional semiconductor memory architecture according to FIG. 1.
Figure 3:
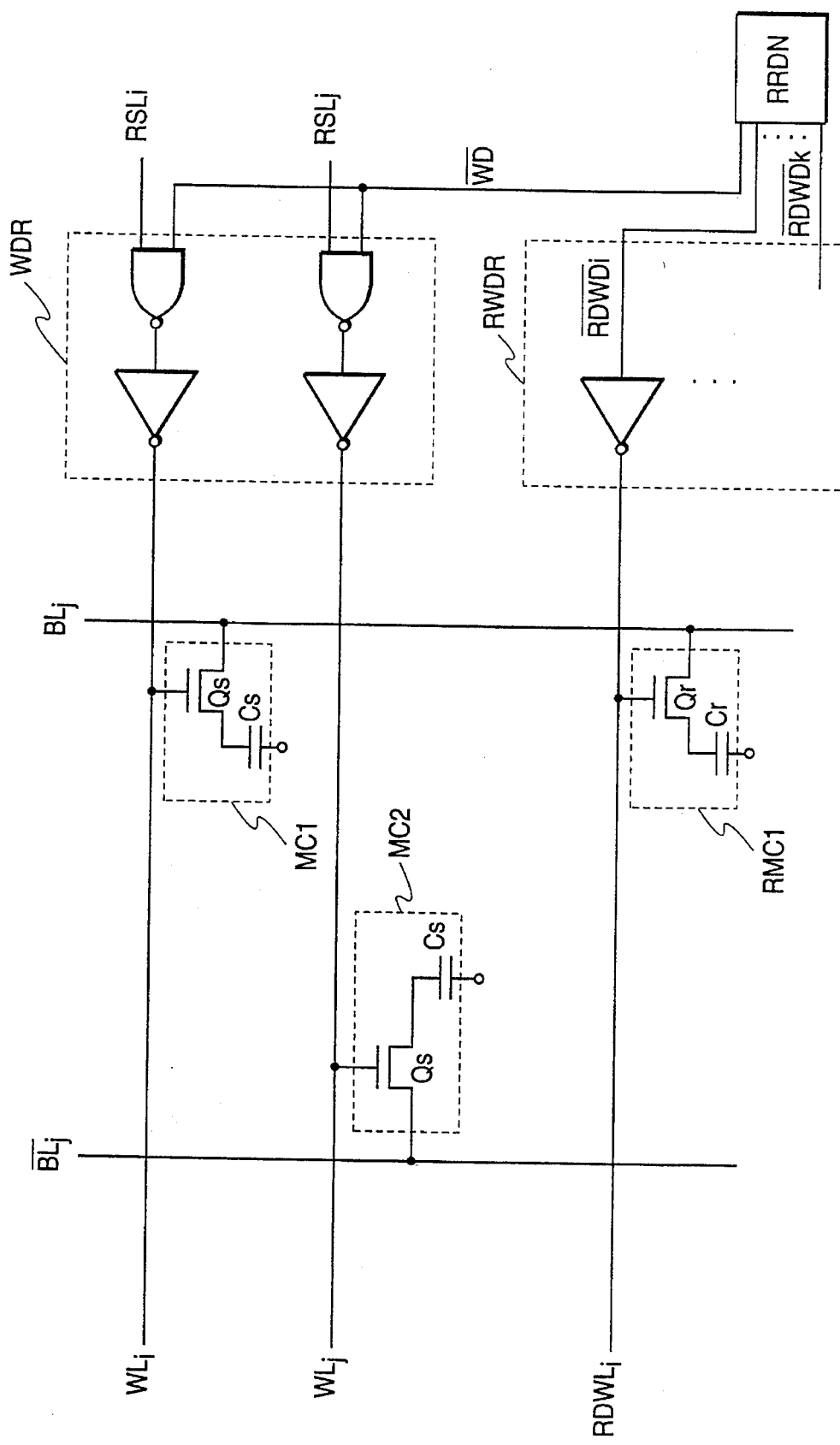
FIG. 3 illustrates a portion of a conventional dynamic random access memory with row redundancy and a row redundancy control circuit.
Figure 4A:
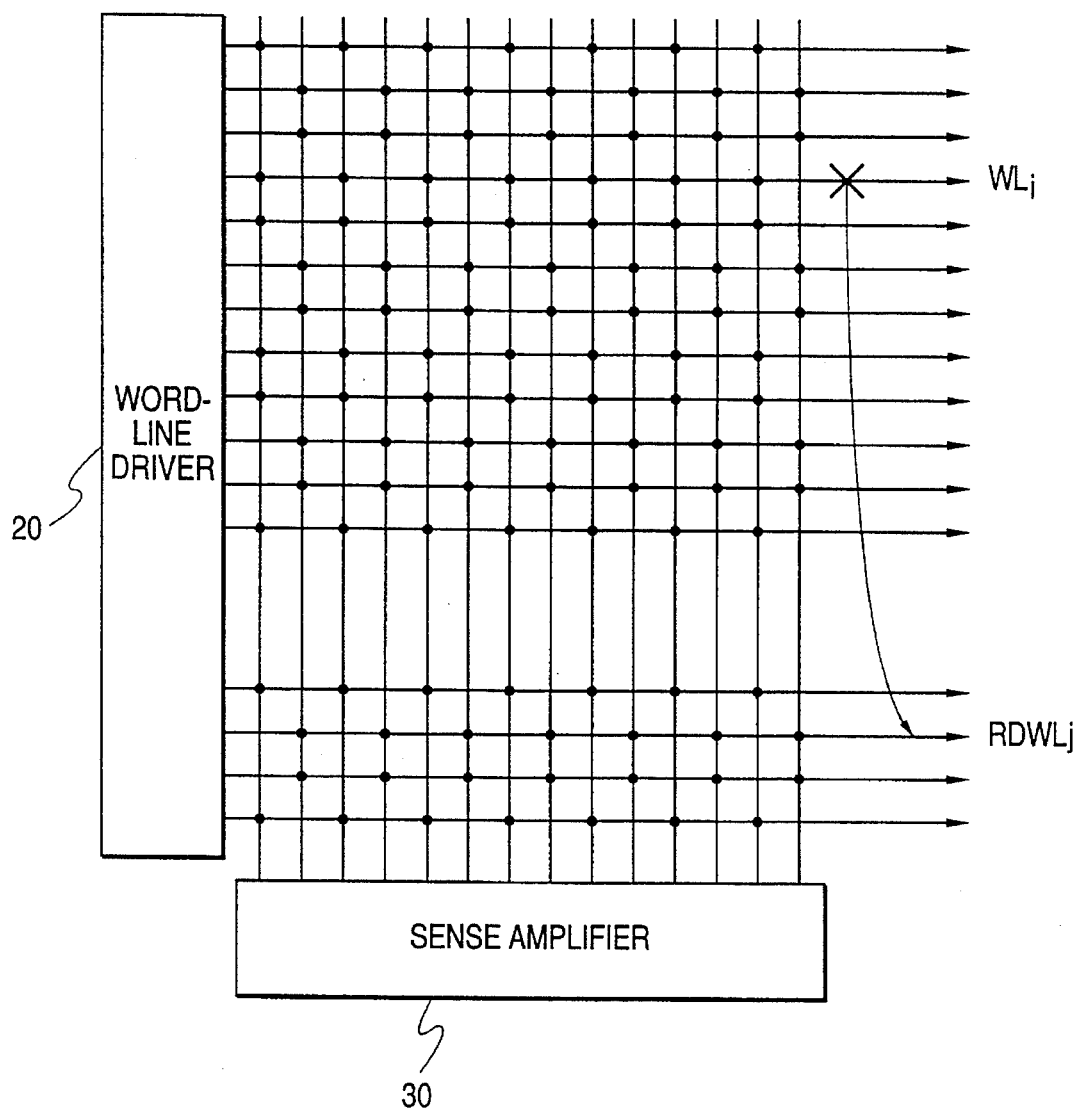
FIGS. 4a and 4b show respective conventional row redundancy architectures.
Figure 4B:
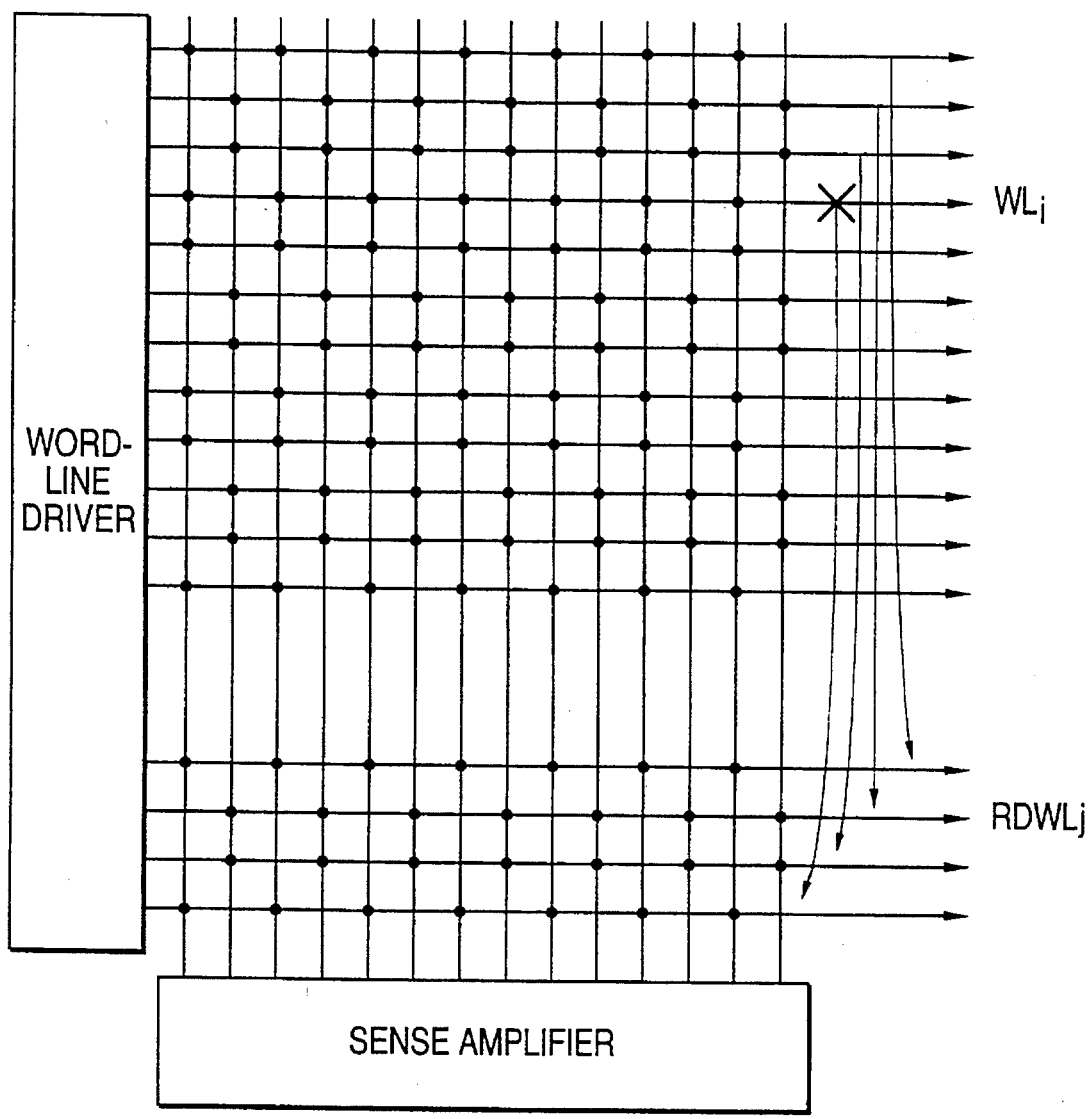
Figure 5:
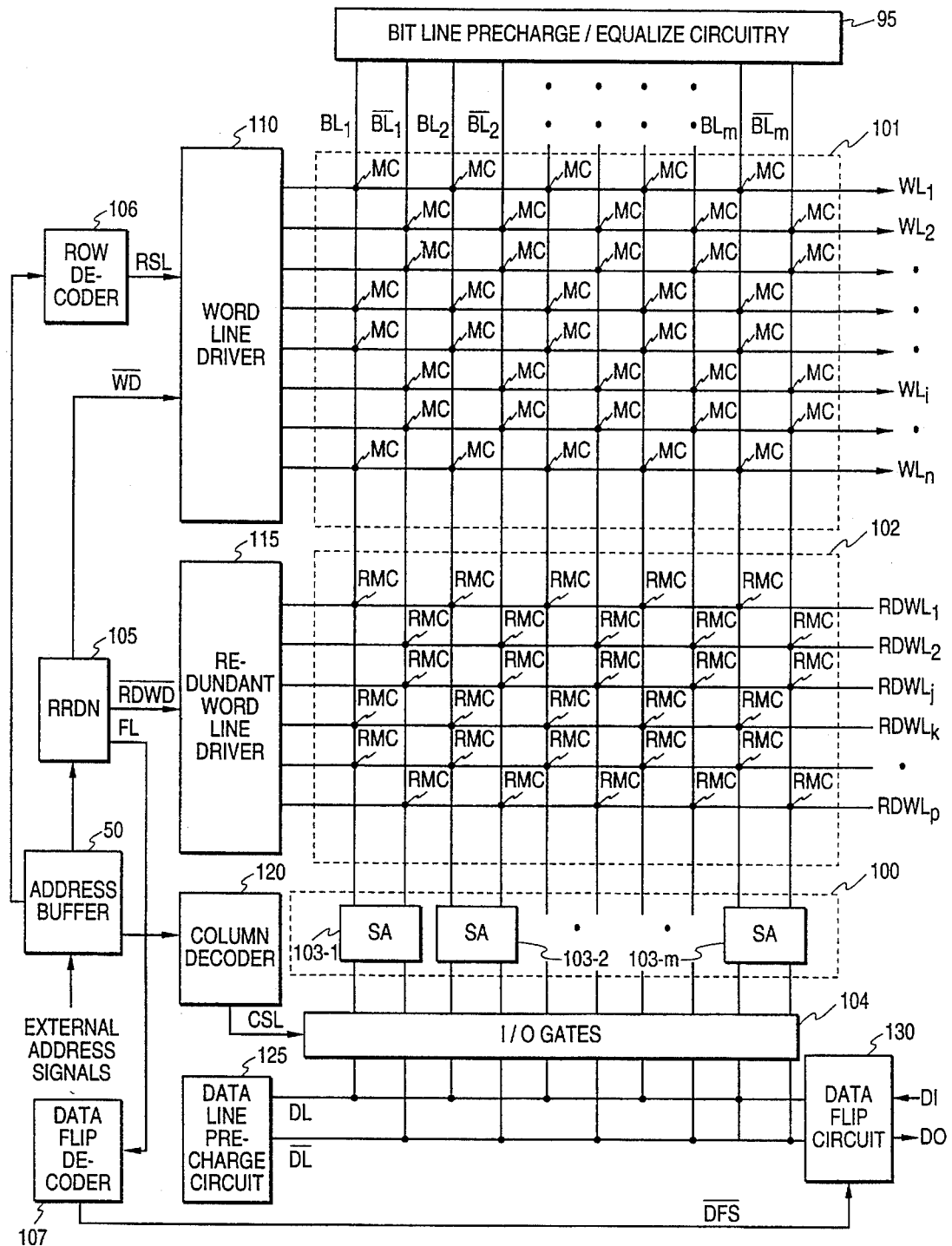
FIG. 5 shows a memory array configuration for a semiconductor memory device with a row redundancy architecture according to the present invention.

FIG. 5 illustrates a semiconductor memory device including a memory cell array having a normal memory cell array portion 101 and a redundant memory cell array portion 102. Normal memory cell array portion 101 includes normal memory cells MC connected to word lines $WL_1$, $WL_2$, ..., $WL_n$ and bit line pairs $BL_1$, $\overline{BL_1}$, ..., $BL_m$, $\overline{BL_m}$. The redundant memory cell array portion 102 includes redundant memory cells RMC connected to redundant word lines $RDWL_1$, $RDWL_2$, ..., $RDWL_p$ and bit line pairs $BL_1$, $\overline{BL_1}$, ..., $BL_m$, $\overline{BL_m}$. As will be explained in greater detail below, the redundant word lines are used to replace ones of the word lines $WL_1$, $WL_2$, ..., $WL_n$ which are determined to be defective during device testing.

A bit line sense amplifier section 100 includes a plurality of sense amplifiers 103-1 to 103-m each of which is respectively connected to a corresponding one of the bit line pairs $BL_1$, $\overline{BL_1}$, ..., $BL_m$, $\overline{BL_m}$. The sense amplifiers 103-1 to 103-m each sense and amplify potential differences between the bit lines of the corresponding bit line pair. The data lines DL, $\overline{DL}$ are connected to the sense amplifiers 103-1 to 103-m via I/O gates 104. The I/O gates 104 are responsive to column select signals CSL for inputting/outputting data to/from the memory cell array. Bit line pre-charge/equalize circuitry 95 equalizes the bit lines of each of the bit line pairs and pre-charges the bit lines to a predetermined voltage.

An address buffer 50 receives external address signals and outputs internal address signals which are strobed into a redundancy control circuit (RRDN) 105, a row decoder 106, and a column decoder 120. The row decoder 106 decodes address signals and generates word line selecting signal RSL. RRDN 105 enables either a signal $\overline{WD}$ to a word line driver 110 for driving one of word lines $WL_1$, $WL_2$, ..., $WL_n$ or a signal $\overline{RDWD}$ to a redundant word line driver 115 for driving one of redundant word lines $RDWL_1$, $RDWL_2$, ..., $RDWL_p$. The column decoder 120 decodes address signals strobed therein and outputs column select signals CSL to select one of the I/O gates 104 determined by the decoded address, whereby data may be transferred to/from the data lines DL, $\overline{DL}$ and the sense amplifier connected to the selected I/O gate. A data line precharge circuit 125 precharges the data lines DL, $\overline{DL}$. RRDN 105 also generates data flip enable signals FL which are forwarded to data flip decoder 107. Based on the data flip enable signals FL, data flip decoder 107 generates a data flip signal $\overline{DFS}$. Responsive to the data flip signal $\overline{DFS}$ generated by data flip decoder 107, a data flip circuit 130 selectively flips or inverts the signals on the data lines DL, $\overline{DL}$.

Referring to FIG. 5, it can be seen that some of the normal memory cells MC will store data whose physical and logical states are the same and other normal memory cells will store data whose physical and logical states are complementary. Thus, for example, in order for the normal memory cells MC connected to the bit lines $BL_1$, $BL_2$, ..., $BL_m$ to store logical "1" data, physical data "1" is written thereto and in order for normal memory cells MC connected to bit lines $\overline{BL_1}$, $\overline{BL_2}$, ..., $\overline{BL_m}$ to store logical data "1", physical data "0" is written thereto. If during device testing it were determined that the word line $WL_i$ was defective, the word line $WL_i$ could be replaced by one of the redundant word lines $RDWL_1$, $RDWL_2$, ..., $RDWL_p$. If the defective word line $WL_i$ is replaced by the redundant word line $RDWL_j$, the physical data state of the redundant memory cells RMC accessed by redundant word line $RDWL_j$ is the same as the physical data state of the normal memory cells MC accessed by word line $WL_i$. Thus, if the physical data state of the normal memory cells MC coupled to word line $WL_i$ were 1, 0, ..., 1, the physical data state of the redundant memory cells RMC coupled to the redundant word line $RDWL_j$ would be 1, 0, ..., 1. If the defective word line $WL_i$ is replaced by the redundant word line $RDWL_k$, the physical data state of the redundant memory cells RMC accessed by the redundant word line $RDWL_k$ is complementary to the physical data state of the normal memory cells MC accessed by the word line $WL_i$. Thus, if the physical data state of the normal memory cells MC coupled to the word line $WL_i$ were 1, 0, ..., 1, the physical data state of the redundant memory cells RMC coupled to the redundant word line $RDWL_k$ would be 0, 1, ..., 0.

In accordance with a first embodiment of the present invention, the data flip circuit 130 is responsive to a data flip signal $\overline{DFS}$ for flipping or inverting the signals on the data lines DL, $\overline{DL}$ when data is read from or written to a memory cell MC connected to a redundant word line such as RDWLk which has replaced a normal word line such as $WL_i$. In this way, the physical data stored in the redundant memory cells RMC matches the physical data which would be stored in the normal memory cells MC. The data flip circuit 130 is further responsive to the data flip signal $\overline{DFS}$ for not flipping or inverting the signals on the data lines DL, $\overline{DL}$ when data is read from or written to a memory cell connected to a redundant word line such as $RDWL_j$ which has replaced a normal word line such as $WL_i$. No flipping is required in the second instance since the physical data stored in the redundant memory cells RMC matches the physical data which would be stored in the normal memory cells MC.

The above-described operation will be discussed in greater detail below with reference to FIGS. 6–9.

Figure 6:
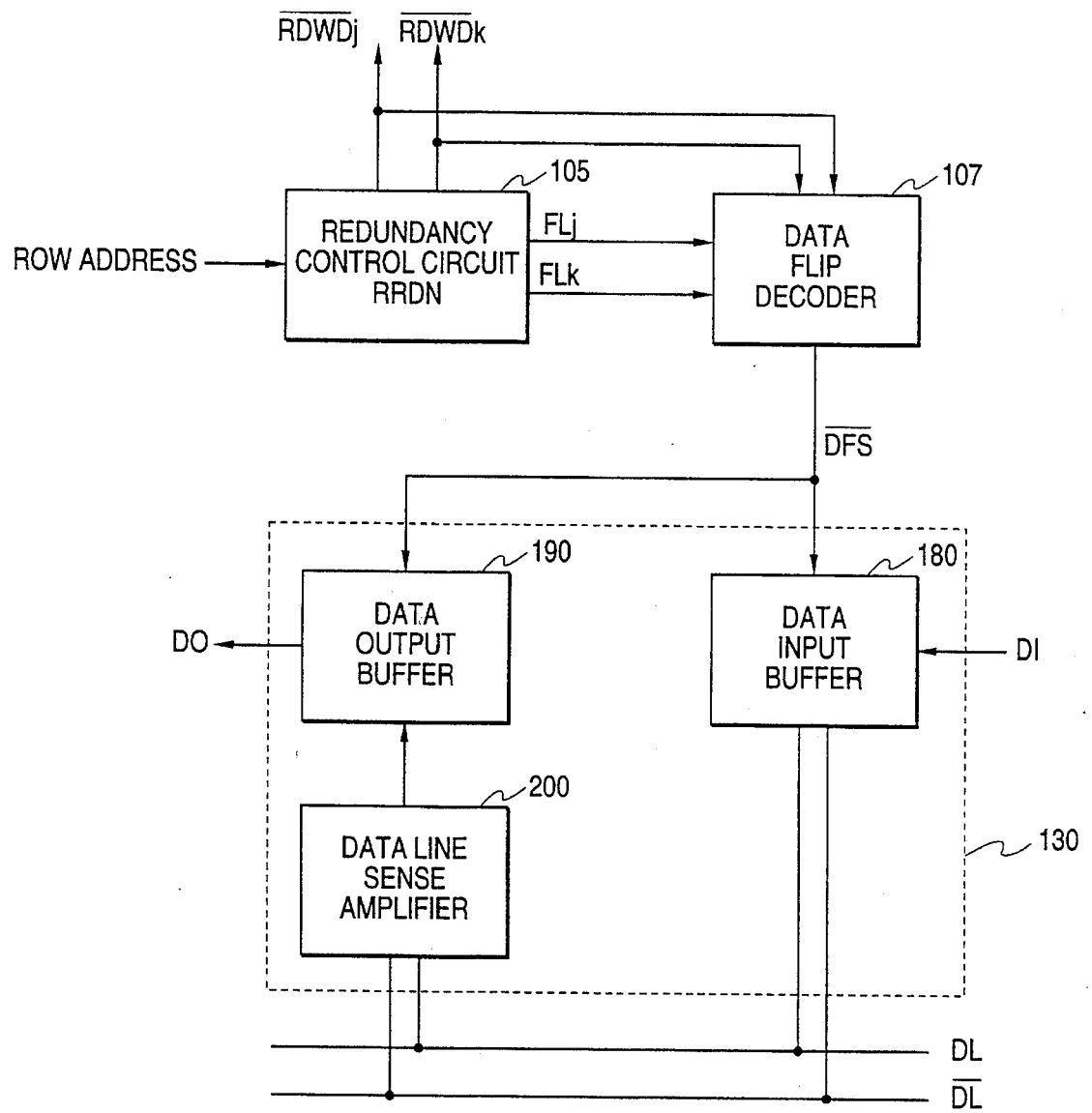
FIG. 6 shows a detailed portion of the semiconductor device of FIG. 5.

FIG. 6 is a more detailed representation of a portion of circuitry in FIG. 5 including data flip circuit 130, RRDN 105, and data flip decoder 107. RRDN 105 receives the row address and generates appropriate redundant word line drive signals $\overline{\text{RDWD}}$j and $\overline{\text{RDWD}}$k and data flip enable signals FLj and FLk in accordance with whether the row address corresponds to a defective normal word line which has been replaced by one of the redundant word lines. The generation of FLj and FLk will be described in greater detail below. Redundant word line drive signals $\overline{\text{RDWD}}$j and $\overline{\text{RDWD}}$k for driving the redundant word lines $\text{RDWL}_j$ and $\text{RDWL}_k$, respectively, are shown in FIG. 6. The data flip decoder 107 receives data flip enable signals FLj and FLk from RRDN 105. The data flip enable signals FLj and FLk indicate whether the physical state of data stored in memory cells connected to a redundant word line is the same as the physical state of data stored in memory cells connected to a defective normal word line when RRDN 105 is enabled. By decoding the data flip enable signals, the data flip decoder 107 generates a control signal $\overline{\text{DFS}}$.

The data flip circuit 130 includes a data input buffer 180 which receives input data DI, a data output buffer 190 which outputs output data DO, and a data line sense amplifier 200. The control signal $\overline{\text{DFS}}$ is supplied to the data input buffer 180 and to the data output buffer 190. When the control signal $\overline{\text{DFS}}$ is active, data input buffer 180 flips or inverts the signals supplied to data lines DL, $\overline{\text{DL}}$. Similarly, when the control signal $\overline{\text{DFS}}$ is active, data output buffer 190 flips or inverts the signals supplied from data lines DL, $\overline{\text{DL}}$.

Figure 7:
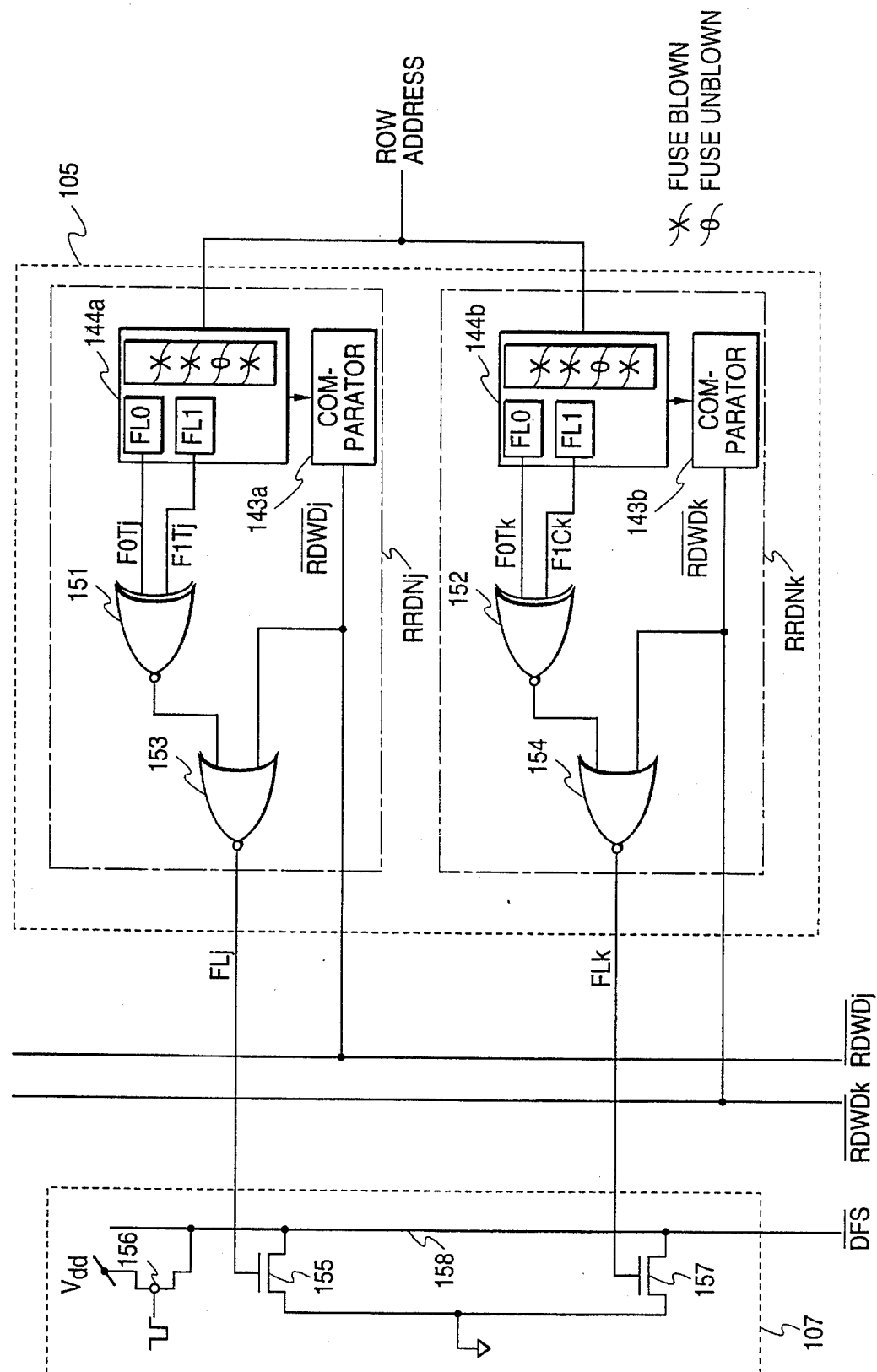
FIG. 7 shows a more detailed representation of the portion of the semiconductor device shown in FIG. 6 according to a first embodiment of the present invention.

FIG. 7 shows a more detailed representation of RRDN 105 and data flip decoder 107 depicted in FIG. 6 according to a first embodiment of the present invention. As shown in FIG. 7, RRDN 105 includes row redundancy control sections RRDNj and RRDNk which are each supplied with a row address. It is to be understood that a typical row redundancy control circuit includes a plurality of row redundancy control sections similar to RRDNj and RRDNk. For example, each row redundancy control section corresponds to a particular row or word line address. The row redundancy control sections RRDNj and RRDNk generate redundant word line drive signals $\overline{\text{RDWD}}_j$ and $\overline{\text{RDWD}}_k$ via comparators 143a and 143b, respectively, for selecting redundant word lines $\text{RDWL}_j$ and $\text{RDWL}_k$ when the row address represents the address of a defective normal word line which has been replaced by these redundant word lines. Fuse sections 144a and 144b in the redundancy control sections RRDNj and RRDNk contain fuse latches (e.g., FL0, FL1, ...) and fuses which are appropriately blown by a laser, for example, to program the address of a selected word line. All the fuse latches FL0, FL1, ... and a master fuse are used by the comparator circuits 143a, 143b, ... which are described further below in more detail, to generate the respective redundant word line drive signals $\overline{\text{RDWD}}$j and $\overline{\text{RDWD}}$k. However, only signals from FL0 and FL1 used for the first and second least significant bit address need to be applied to logic gates 151 and 152 for data flip control because the word line pattern repeats every four word lines.

There are two types of operation typically associated with semiconductor memory devices, normal operation and test operation. Normal operation has two operating modes, redundancy mode and normal mode (i.e., non-redundancy mode).

When the selected word line is a non-defective word line, a master fuse (not shown), one corresponding for each row redundancy control section, has not been blown, for example during a test operation, indicating normal mode. However, when the selected word line is a defective word line, a master fuse in one of the row redundancy control section has been blown during a test operation indicating redundancy mode is to be implemented. Accordingly, a defective word line is replaced by a redundant word line during normal operation redundancy mode. The address of the selected word line is identified by the state (i.e., blown or not blown) of the fuses in each fuse section 144a and 144b. In the example shown in FIG. 7, the fuse latch state signals FOTj and F1Tj are output from fuse section 144a in redundancy control section RRDNj and fuse latch state signals F0Tk and F1Ck are output from fuse section 144b in row redundancy control section RRDNk.

The row redundancy control sections RRDNj and RRDNk further include exclusive NOR (XNOR) gates 151 and 152, respectively and NOR gates 153 and 154, respectively. The XNOR gate 151 receives signals FOTj and F1Tj from fuse section 144a and supplies the logic result to a first input of NOR gate 153. A second input of NOR gate 153 is supplied with redundant word line drive signal $\overline{\text{RDWD}}$j and NOR gate 153 generates a data flip enable signal FLj based on the logic result of XNOR gate 151 and redundant word line drive signal $\overline{\text{RDWD}}$j. Likewise, XNOR gate 152 receives signals FOTk and F1Ck from fuse section 144b and supplies the logic result to a first input of NOR gate 154. A second input of NOR gate 154 is supplied with the redundant word line drive signal $\overline{\text{RDWD}}$k and NOR gate 154 generates a data flip enable signal FLk based on the logic result of XNOR gate 152 and redundant word line drive signal $\overline{\text{RDWD}}$k.

As shown in FIG. 7, the data flip decoder 107 includes CMOS transistors 155 and 157, and a precharge MOS transistor 156. The data flip enable signals FLj and FLk from RRDN 105 are input to the gates of CMOS transistors 155 and 157, respectively. As shown, CMOS transistors 155 and 157 are part of a dynamic NOR scheme. However, it is to be understood that a static NOR scheme may also be used. The terminals of the CMOS transistors 155 and 157 are connected between the control signal line 158 for the data flip control signal $\overline{\text{DFS}}$ and ground.

When either FLj or FLk rises, the data flip control signal $\overline{\text{DFS}}$ falls and becomes active. The data flip decoder 107 supplies the data flip control signal $\overline{\text{DFS}}$ to the data flip circuit 130 (see FIG. 5). The data flip circuit 130 responds to an active data flip control signal $\overline{\text{DFS}}$ to flip the data signals on the data lines DL, $\overline{\text{DL}}$. The data flip enable signals FLj and FLk are wired ORed on the control signal line 158. Prior to enabling the wired OR function, a precharging transistor 156 precharges control signal line 158 to a predetermined voltage such as Vdd. The precharge transistor 156 has its gate connected to receive a control pulse and its terminals connected between Vdd and the control signal line 158.

Examples of the operation of RRDN 105 and data flip decoder 107 will be discussed below with reference to FIGS. 5 and 7. In a first example, assume that redundant word line RDWLj replaces word line WLi which has been determined to be defective during device testing. Accordingly, the corresponding master fuse in redundancy control section RRDNj has been blown indicating redundancy mode. It can be seen with reference to FIG. 5 that the physical state of data stored in the memory cells connected to redundant word line RDWLj is the same as the physical state of the data stored in the memory cells connected to normal word line WLi.

Further, assume that fuses FL0 and FL1 of RRDNj have been blown by a laser in a manner known in the art in order to program the address corresponding to word line WLi. Thus, fuse latch state signals FOTj (fuse 0 true) and F1Tj (fuse 1 true) from fuse latches FL0 and FL1 of RRDNj are both low. The output signals FOTj and F1Tj are supplied to XNOR gate 151. Since F0Tj and F1Tj are both low, the logic result of the XNOR operation carried out by XNOR gate 151 is high. The NOR gate 153 receives the high output from XNOR gate 151 and the redundant word line drive signal $\overline{RDWD}j$. The data flip enable signal FLj output from NOR gate 153 will be low even when the redundant word line drive signal $\overline{RDWD}j$ selects the redundant word line RDWLj.

Since FLj remains low, transistor 155 remains OFF and the signal $\overline{DFS}$ on data flip signal line 158 which has been precharged to a voltage Vdd remains high. Since the signal $\overline{DFS}$ supplied to data flip circuit 130 is high, data flip circuit 130 does not flip the signals on data lines DL, $\overline{DL}$. That is, since the physical state of data stored in the memory cells coupled to redundant word line RDWLj is the same as the physical state of data stored in memory cells coupled to word line WLi, the bit information in the memory cells connected to redundant word line RDWLj matches the bit information which would be stored in the memory cells connected to defective normal word line WLi. Accordingly, it is not necessary to flip the data lines to maintain consistency between the bit information.

In a second example, assume that redundant word line RDWLk replaces word line WLi which has been determined to be defective during device testing. It can be seen with reference to FIG. 5 that the physical bit information stored in the memory cells connected to redundant word line RDWLk is complementary to the physical bit information stored in the memory cells connected to normal word line WLi.

Further, assume that fuses FL0 and FL1 of RRDNk have been blown by a laser in a manner known in the art in order to program the address corresponding to word line WLi. Thus, fuse latch state signals F0Tk and F1Ck from fuse latches FL0 and FL1 of RRDNk are low and high, respectively. The output signals F0Tk and F1Ck are supplied to XNOR gate 152. Since F0Tk and F1Ck are low and high, respectively, the logic result of the XNOR operation carried out by XNOR gate 152 is low. The NOR gate 154 receives the low output from XNOR gate 152 and the redundant word line drive signal $\overline{RDWD}k$. In this case, data flip enable signal FLk output from NOR gate 154 will be high when redundant word line drive signal $\overline{RDWD}k$ selects redundant word line RDWLk.

Since FLk goes high, transistor 157 turns ON and the signal $\overline{DFS}$ on data flip control signal line 158 which has been precharged to a voltage Vdd goes low. Since the signal $\overline{DFS}$ supplied to data flip circuit 130 is low, data flip circuit 130 flips the signals on data lines DL, $\overline{DL}$. That is, since the physical state of data stored in the memory cells coupled to redundant word line RDWLj is complementary to the physical state of data stored in memory cells coupled to word line WLi, the bit information in the memory cells connected to redundant word line RDWLj does not match the bit information which would be stored in the memory cells connected to defective normal word line WLi. Accordingly, data flip circuit 130 flips the data lines DL, $\overline{DL}$ to maintain consistency between the bit information.

Figure 8A:
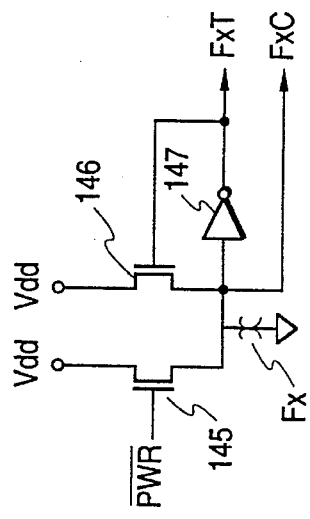
FIG. 8a shows a fuse latch section in the redundancy control circuit depicted in FIG. 7.
Figure 8B:
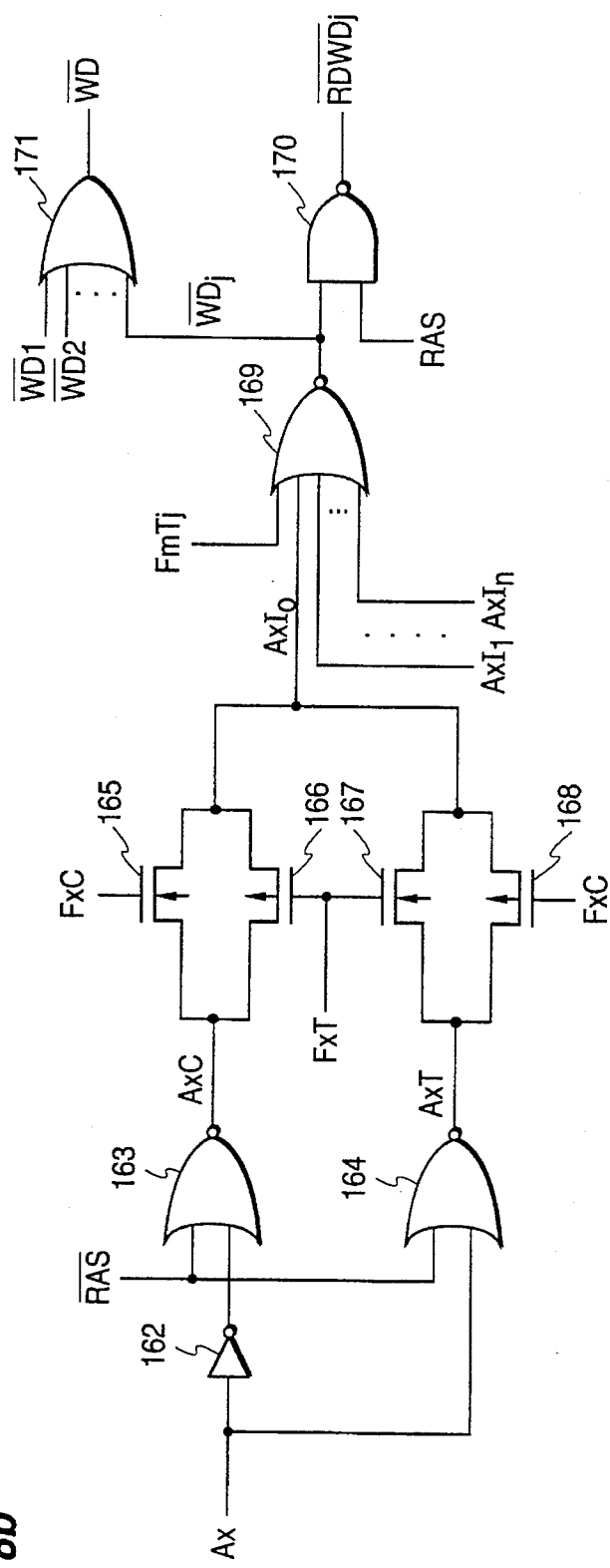
FIG. 8b shows a comparator in the redundancy control circuit depicted FIG. 7.

FIGS. 8a and 8b show a more detailed representation of an exemplary row redundancy control section. FIG. 8a shows an illustrative fuse latch circuit (FLx) which is utilized in fuse sections 144a and 144b shown in FIG. 7 and may be used for the each master fuse as well. Fuse latch circuit FLx includes two MOS transistors 145 and 146, and an inverter 147. The MOS transistors 145 and 146 each have a first terminal connected to a power source voltage Vdd and a second terminal connected to fuse Fx. The gate of MOS transistor 145 receives a power pulse $\overline{PWR}$ and the gate of MOS transistor 146 is driven by the fuse latch state signal FxT which is output by inverter 147. The input terminal of the inverter 147 is coupled to the second terminals of MOS transistors 145 and 146, and to fuse Fx. Fuse Fx may be a fuse capable of being blown by a laser.

Responsive to the power pulse signal $\overline{PWR}$ supplied to the gate of the MOS transistor 145, fuse latch circuit FLx generates the fuse latch state signals FxT and FxC which represent the state of the corresponding fuse Fx. If the fuse Fx is blown, then FxT would be low and FxC would be high. If the fuse Fx is not blown, then FxT would be high and FxC would be low.

FIG. 8b represents an illustrative comparator such as 143a shown in FIG. 7. An address bit Ax is supplied to the exemplary comparator portion of FIG. 8b. The address bit Ax is inverted by an inverter 162 and supplied to a first input of NOR gate 163. Address bit Ax is also supplied to a first input of NOR gate 164. A row address strobe $\overline{RAS}$ signal is supplied to a second input of NOR gate 163 and to a second input of NOR gate 164. NOR gates 163 and 164 generate signals AxC (address bit complement) and AxT (address bit true), respectively, when the row address strobe signal $\overline{RAS}$ is active. When generated, the AxC signal is supplied to CMOS transistor pair, NMOS transistor 165 and PMOS transistor 166, and the AxT signal is supplied to CMOS transistor pair, NMOS transistor 167 and PMOS transistor 168. The signal FxT is supplied to the gates of transistors 166 and 167 and the signal FxC is supplied to the gates of transistors 165 and 168. If the fuse Fx is blown (i.e., FxC high), the output signal $AxI_0$ from the CMOS transistor arrangement is AxC. If the fuse Fx is not blown, the output signal $AxI_0$ from the CMOS transistor arrangement is AxT.

The signal $AxI_0$ is supplied to a NOR circuit 169 which receives signals ($AxI_0$, $AxI_1$, ... $AxI_n$) from each of the CMOS transistor arrangements in the comparator circuit and the corresponding master fuse signal FmTj from a master fuse latch circuit. Each of the signals $AxI_0$, $AxI_1$, ... $AxI_n$ corresponds to a respective address bit ($A_0$-$A_n$) of a word line address and the master fuse indicates the applicable mode of normal operation, that is redundancy mode or normal mode. NOR circuit 169 generates a word line drive signal $\overline{WD}j$. The word line drive signal $\overline{WD}j$ is input to an OR gate 171 where it is ORed with the word line drive signals ($\overline{WD}1$, $\overline{WD}2$, ..., $\overline{WD}j$) from each comparator circuit to generate a word line drive signal $\overline{WD}$ which enables the word line driver 110 shown in FIG. 5. That is, when all the word line drive signals ORed are active (low), then the word line drive signal $\overline{WD}$ is low and active and the system is in normal mode. Otherwise, if one of the word line drive signals ORed is high then the system is in redundancy mode and word line drive signal $\overline{WD}$ is high and inactive.

When the corresponding master fuse FmTj input to NOR gate 169 is not blown (FmTj is high), then normal mode is selected and the word line drive signal $\overline{WD}j$ is low regardless of the address. However, if the master fuse FmTj is blown (i.e., FmTj is low), then the NOR gate 169 will indicate redundancy mode depending on the signals $AxI_0$, $AxI_1$, ... $AxI_n$ input. More specifically, when the signals $AxI_0$, $AxI_1$, ... $AxI_n$ are all low, a proper address has been input to the NOR gate 169 and the word line drive signal $\overline{WD}j$ is high and inactive (i.e., redundancy mode).

The word line drive signal $\overline{WD}j$ is supplied to a first input of a NAND gate 170 which generates the redundant word line drive signal $\overline{RDWD}j$. The row address strobe signal RAS is supplied to a second input of NAND gate 170. If the signal $\overline{WDj}$ falls (normal word line access) before RAS rises, the redundant word line drive signal $\overline{RDWDj}$ output from the NAND gate 170 remains high, disabling redundancy mode. Redundancy mode is only enabled when the redundant word line drive signal $\overline{RDWDj}$ output from NAND gate 170 goes low. This occurs when the word line drive signal $\overline{WDj}$ remains high and RAS is high and active.

Figure 9:
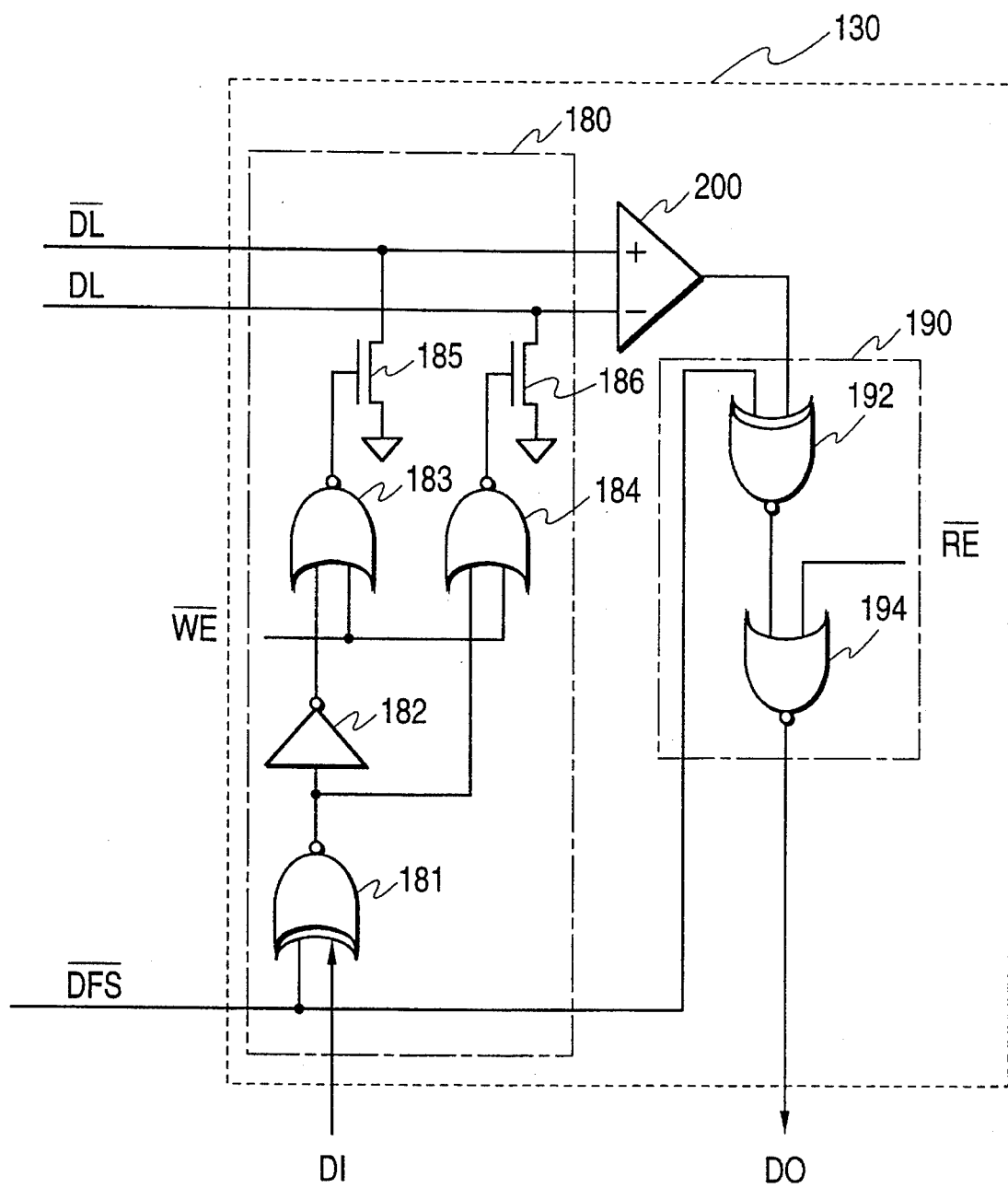
FIG. 9 shows a more detailed representation of the data flip circuit depicted in FIG. 5.

FIG. 9 is a more detailed representation of the data flip circuit 130 of FIG. 5. The control signal $\overline{DFS}$ is supplied from data flip decoder 107 to data input buffer 180 and data output buffer 190. A low (active) control signal $\overline{DFS}$ triggers the data on the data lines DL, $\overline{DL}$ to be flipped during the read and write operations.

In data input buffer 180, an XNOR gate 181 receives the $\overline{DFS}$ control signal at a first input and input data DI at a second input. When the $\overline{DFS}$ control signal is active, the state of the data input bit is flipped (i.e., either from 1 to 0 or from 0 to 1), and when $\overline{DFS}$ is inactive the state of the data input remains the same. In other words, the logic output of the XNOR gate 181 is either the flipped data input bit when $\overline{DFS}$ is low or the data input bit when $\overline{DFS}$ is high. The logic output of XNOR gate 181 is forwarded to an inverter 182 which inverts the logic output and supplies the inverted logic output to a first output of NOR gate 183. NOR gate 183 NORs the inverted logic output with the write enable signal $\overline{WE}$. Also, the logic output of XNOR gate 181 is supplied to a NOR gate 184 where it is NORed with the write enable signal $\overline{WE}$.

The outputs of the NOR gates 183 and 184 are respectively supplied to the gates of MOS transistors 185 and 186. The terminals of the transistor 185 are connected between the data line $\overline{DL}$ and ground and the terminals of transistor 186 are connected between the data line DL and ground. When data is to be written to the memory cells, the write enable signal $\overline{WE}$ becomes active (low). Therefore, when the write enable signal $\overline{WE}$ is active, one of the MOS transistors 185, 186 will be turned on, thereby pulling the attached data line, $\overline{DL}$ or DL, low. When the data is flipped, the bit information on the data line DL is the complement of the data input bit. The bit information on the data lines DL, $\overline{DL}$ is forwarded to the memory cells via the bit lines BL and $\overline{BL}$. When $\overline{WE}$ is high, no bit information is provided to the data lines DL, $\overline{DL}$.

The $\overline{DFS}$ control signal is also supplied to the data output buffer 190. Referring to FIG. 5, during a read operation, the row decoder 106, through word line selecting signal RSL sent to word line driver 110, selects one of the word lines $WL_i$ causing its potential to increase. Charge stored in the memory cells connected to the selected word line is read out to the corresponding bit lines. The bit line sense amplifiers in the sense amplifier section 100 are activated to sense and amplify small potential differences between the bit lines of the bit line pairs. In accordance with the column selection signals CSL, the complementary data from one of the sense amplifiers is coupled to the data lines DL, $\overline{DL}$. Thereafter, the data on the data lines DL, $\overline{DL}$ is input to the data line sense amplifier 200 which obtains a single bit of information and outputs the information bit via a data output buffer 190 in accordance with the $\overline{DFS}$ signal. Prior to the read operation, the data line precharge circuit 125 shown in FIG. 5 precharges the data lines DL, $\overline{DL}$ to Vdd.

Referring to FIG. 9, the bit output from the data line sense amplifier 200 and the $\overline{DFS}$ control signal are forwarded to an XNOR gate 192 in data output buffer 190. When $\overline{DFS}$ is active, the logic output of the XNOR gate 192 is a flipped representation of the bit output from the data line sense amplifier 200. When $\overline{DFS}$ is inactive, the logic output is the output bit of the data line sense amplifier 200. The logic output is then forwarded to a NOR gate 194 which also receives the read enable signal $\overline{RE}$ for a read operation. When the read enable signal $\overline{RE}$ is low, the logic output bit is supplied to an external device (not shown).

Several advantages are realized by the aforementioned first embodiment. For example, the design space can be minimized because a single redundant word line can replace a defective normal word line whether or not it stores data in the same physical state as the defective normal word line. This allows a single redundancy word line element to be used to fix one defect without limiting efficiency, and thus reduces the design space. This is particularly important for large DRAMs of 256 Mb and beyond that require many redundancy word line elements or redundancy arrays.

In accordance with a second embodiment of the present invention, a data flip circuit is responsive to a data flip signal for flipping or inverting the signals on data lines DL, $\overline{DL}$ whenever data is read from or written to a memory cell. In this way, the same physical data may be stored in all normal memory cells MC and all the redundant memory cells RMC. According to a second embodiment of the present invention, all cells are adjusted to have the same bit pattern (T), i.e., to hold the same information in the same state, regardless of the row addresses of the memory cells. To implement such a scheme, the data flip decoder 107 may be replaced by the data flip decoder 107' shown in FIG. 10*a*. According to an illustrative example, data flip decoder 107' is adapted for a half pitch non-twisted bit line architecture shown in FIG. 10*b* with the word lines WL and redundant word lines RDWL. In accordance with the illustrative example in FIGS. 10*a* and 10*b*, in normal mode, the bit pattern for the original memory cell array is determined by the row addresses A0 and A1 as represented by the logic table of FIG. 10*c*. More particularly, the bit pattern of the accessed cell is not true (C) when both A0 and A1 are of opposite state (i.e., low and high, or high and low).

Figure 10A:
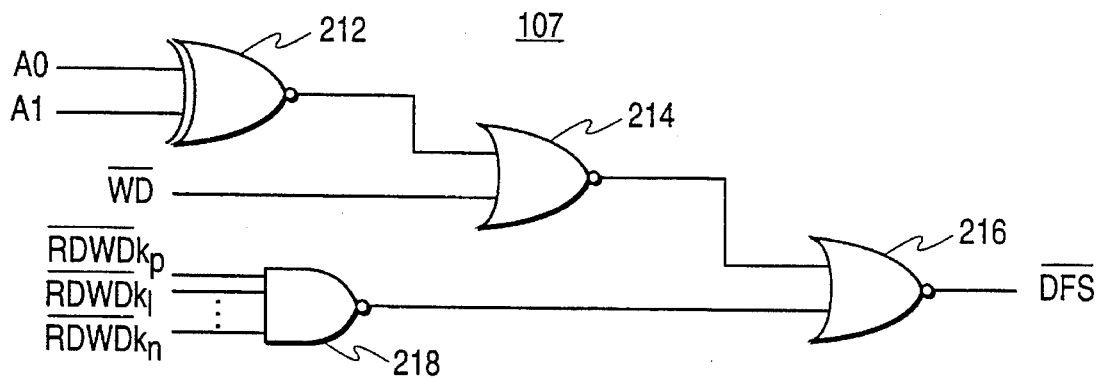
FIG. 10a shows a data flip decoder according to a second embodiment of the present invention.
Figure 10B:
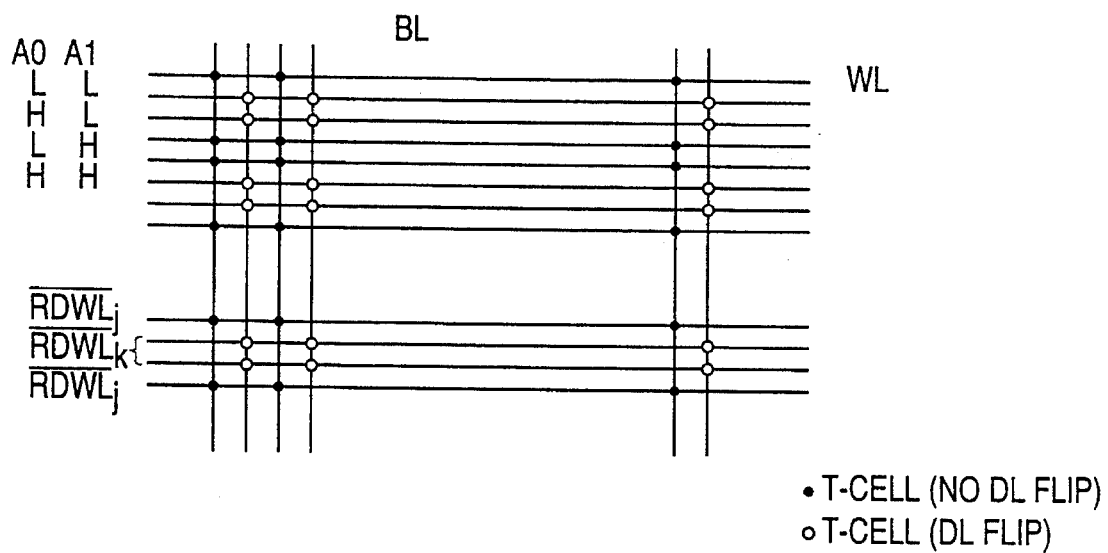
FIG. 10b shows a bit line/word line architecture employed in the second embodiment of the present invention.

Referring to FIG. 10*a*, when the semiconductor memory device performs an operation in the normal mode, the word line drive signal $\overline{WD}$ is active (low). Consequently, in the normal mode, the output of XNOR gate 212 is the opposite of the output of the NOR gate 214 and is the same as the $\overline{DFS}$ signal output from the NOR gate 216. The word line drive signal WD is supplied to the NOR gate 214 from the output of the NOR gate 169 (FIG. 8*b*) described above. The data lines are flipped only when the bit pattern on the accessed cell is not true (C). During the normal mode, the output of NAND gate 218 is low permitting the row addresses A0 and A1 to control the $\overline{DFS}$ signal output from the NOR gate 216 as can be seen in the logic table of FIG. 10*c*. In normal mode, the redundant word line drive signals $\overline{RDWDj}$ and $\overline{RDWDk}$ are both high and inactive. The $\overline{DFS}$ control signal is fed to the circuit of FIG. 7, and data is flipped when the signal is active as discussed above.

When the semiconductor memory device is in redundancy mode, normal mode word line drive signal $\overline{WD}$ supplied from the NOR gate 169 (FIG. 8*b*) is inactive (high). Thus, a low signal output from the NOR gate 214 is fed to the NOR gate 216, and the output of the NAND gate 218 controls the generation of the $\overline{DFS}$ control signal. Each comparator (FIG. 8*b*) section may generate plural redundant word line drive signals. Each redundant word line drive signal $\overline{RDWk}$ ( $\overline{RDWDk_0}$, $\overline{RDWDk_1}$, ..., $\overline{RDWDk_n}$) is generated by a NAND gate 162 as described with reference to FIG. 8*b*. NAND gate 218 only receives the redundant word line drive signals represented by $\overline{RDWDk}$ ($\overline{RDWDk_0}$, $\overline{RDWDk_1}$, ..., $\overline{RDWDk_n}$) which are the redundant word lines coupled to memory cells having a complementary bit pattern. Thus, when one of the inputs to NAND gate 218 is active, the bit pattern of the memory cells coupled to the selected redundant word line which is replacing the defective memory cell is not true (C). Every redundant word line drive signal ($\overline{RDWDj}$ and $\overline{RDWDk}$) is supplied from NAND gate 170 in FIG. 8b to the redundant word line driver 115 in FIG. 5, although only the complementary redundant word line drive signals $\overline{RDWDk}$ are input to NAND gate 218.

In the logic table of FIG. 10c, the redundant word line drive signal $\overline{RDWDk}$ represents whether true (T) bit pattern memory cells are coupled to the selected redundant word line when in redundancy mode. If all the signals $\overline{RDWDk}$ are high, then true bit pattern memory cells are coupled to the selected redundant word line. Accordingly, the output of the NAND gate 218 is low and the $\overline{DFS}$ control signal is high (i.e., inactive) and the data lines will not be flipped. When a redundant word line coupled to memory cells having a complementary bit pattern has been selected to replace a defective word line, the output of the NAND gate 218 is high thereby forcing the $\overline{DFS}$ control signal generated by the NOR gate 216 low. Thereafter, the data lines DL, $\overline{DL}$ are flipped in accordance with the description of FIG. 9 provided above.

The second embodiment provides several advantages in addition to the advantages in the first embodiment. When testing whether a cell is defective, data is read from and written to each memory cell. According to the second embodiment, when a tester accesses a memory cell having a data pattern that is not true (C), the data lines are always flipped. Thus, to detect a '0', the same bit data (i.e., '0') can be supplied to every memory cell rather than supplying a '0' to the true bit pattern memory cells and supplying a '1' to the complementary bit pattern memory cells. In sum, because the data lines corresponding to the complementary bit pattern memory cells are flipped, all memory cells have the same bit pattern (T). Consequently, the testing of memory cells can be carried out in one step using a single data bit rather than in two steps in which opposite data must be respectively supplied for memory cells with true and complementary bit patterns. As a result, programming and testing time can be reduced with the second embodiment. Addressing problems are also eliminated because the same data is supplied to every cell and design space can be further minimized.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A semiconductor memory device, comprising:

memory cells arranged in rows and columns, said memory cells including normal memory cells and redundant memory cells for replacing defective ones of said normal memory cells;

bit line pairs connected to said memory cells, each bit line pair consisting of first and second bit lines which are respectively connected to memory cells for storing true data and memory cells for storing complementary data in corresponding ones of said columns;

word lines, said word lines including normal word lines each respectively connected to normal memory cells in a corresponding one of said rows and redundant word lines each respectively connected to redundant memory cells in a corresponding one of said rows, said normal word lines including a first normal word line for selecting a first normal memory cell for storing true data connected to the first bit line of one of said bit line pairs and a second normal word line for selecting a second normal memory cell for storing complementary data connected to the second bit line of said one of said bit line pairs, and said redundant word lines including a first redundant word line for selecting a first redundant memory cell for storing true data connected to the first bit line of said one of said bit line pairs and a second redundant word line for selecting a second redundant memory cell for storing complementary data connected to the second bit line of said one of said bit line pairs;

a data line pair consisting of first and second data lines for inputting/outputting complementary data signals to/from said bit line pairs;

a data flip circuit for selectively flipping the data signals on said first and second data lines: and redundancy control means for controlling said data flip circuit to flip the data signals on said first and second data lines when said first normal memory cell connected to said first normal word line is replaced with said second redundant memory cell connected to said second redundant word line or when said second normal memory cell connected to said second normal word line is replaced with said first redundant memory cell connected to said first redundant word line.

2. The semiconductor memory device according to claim 1, further comprising:

sense amplifiers each respectively connected to a corresponding one of said bit line pairs for amplifying a potential difference between said first and second bit lines of the respectively corresponding one of said bit line pairs.

3. The semiconductor device according to claim 1, wherein said redundancy control means includes a decoder for generating a data flip control signal, said decoder supplying the data flip control signal to said data flip circuit wherein the data flip circuit flips the data signals according to the data flip control signal.

4. The semiconductor memory device according to claim 3, wherein said data flip circuit includes a data input buffer for receiving a data input bit, the data input bit being flipped when the data flip control signal is active during a write operation, and supplying a representation of the flipped or unflipped data input bit to said first and second data lines.

5. The semiconductor memory device according to claim 3, wherein said data flip circuit includes a data output buffer, coupled to said first and second data lines, which receives a data output bit representing bit information on said first and second data lines, the data output bit being flipped when the data flip control signal is active during a read operation, and reading out one of the flipped or unflipped data output bit.

6. The semiconductor memory device according to claim 3, wherein the data flip circuit responsive to a first level of the data flip control signal flips the data signals on said first and second data lines when said first memory cell connected to said first normal word line is replaced with said second redundant memory cell connected to said second redundant word line or when said second normal memory cell connected to second normal word line is replaced with said first redundant memory cell connected to said first redundant word line, or the data flip circuit responsive to a second level of the data flip control signal does not flip the data signals on said first and second data lines when said first normal memory cell connected to said first normal word line is replaced with said first redundant memory cell connected to said first redundant word line or when said second normal memory cell connected to said second normal word line is replaced with said second redundant memory cell connected to said second redundant word line.

7. The semiconductor memory device according to claim 3, wherein said decoder receives an address of one of said first or second normal memory cells to be accessed and generates a redundant word line drive signal to drive one of said first or second redundant word lines to access one of said first or second redundant memory cells to replace said one of said first or second normal memory cells when said one of said first or second normal memory cells is defective, said decoder generating the data flip control signal according to whether said one of said first or second normal memory cells and said one of said first or second redundant memory cells both store true or complementary data.

8. The semiconductor memory device according to claim 7, wherein if said one of said first or second normal memory cells and said one of said first or second redundant memory cells both store true or complementary data, the data flip control signal is in a non-flip state wherein the data signals are not flipped, and if said one of said first or second normal memory cells and said one of said first or second redundant memory cells do not both store true or complementary data the data flip control signal is in a flip state wherein the data signals are flipped.

9. The semiconductor memory device according to claim 7, wherein said decoder includes a comparator circuit for determining whether the received normal memory cell address corresponds to a defective memory cell address, said comparator circuit generating the redundant word line drive signal when the received normal memory cell address corresponds to the defective memory cell address.

10. A semiconductor memory device, comprising:
a plurality of normal and redundant memory cells connected to word lines and bit lines, a first group of said word lines coupled to normal and redundant memory cells having a first bit pattern and a second group of said word lines coupled to normal and redundant memory cells having a second bit pattern different from said first bit pattern;
first and second data lines, said first data line being coupled to a first group of bit lines and said second data line being coupled to a second group of said bit lines;
a data flip circuit for flipping data signals on said first and second data lines when a normal memory cell coupled to said second group of word lines is coupled to said data lines and when a redundant memory cell coupled to said second group of word lines is coupled to said data lines.

11. The semiconductor memory device according to claim 10, further comprising:
a decoder for generating a data flip control signal, said decoder supplying the data flip control signal to said data flip circuit wherein the data flip circuit flips said data signals according to the data flip control signal.

12. The semiconductor memory device according to claim 11, wherein said decoder receives a memory cell address and includes a logic circuit for generating the data flip control signal by determining whether the received memory cell address is from said first group or said second group of said word lines.

13. The semiconductor memory device according to claim 10, wherein the first bit pattern is complementary to the second bit pattern.

14. The semiconductor memory device according to claim 10, wherein the same physical data can be stored in all the normal memory cells and all the redundant memory cells.

15. A method for testing a semiconductor memory device comprising the steps of:
inputting identical data signals to true bit pattern memory cells and complementary bit pattern memory cells;
accessing the data signals from the true bit pattern memory cells and the complementary bit pattern memory cells;
flipping the data signals accessed from the complementary bit pattern memory cells; and
determining whether the flipped data signals and the data signals accessed from the true bit pattern memory cells are the same, wherein if the flipped data signals and the data signals accessed from the true bit pattern memory cells are not the same a defective memory cell has been detected.

16. A semiconductor memory device with row redundancy comprising:
bit line pairs each consisting of a first bit line and a second bit line;
a first normal word line for selecting a first normal memory cell for storing true data connected to said first bit line of one of said bit line pairs;
a second normal word line for selecting a second normal memory cell for storing complementary data connected to said second bit line of said one of said bit line pairs;
a first redundant word line for selecting a first redundant memory cell for storing true data connected to said first bit line of said one of said bit line pairs;
a second redundant word line for selecting a second redundant memory cell for storing complementary data connected to said second bit line of said one of said bit line pairs;
a data line pair consisting of a first data line and a second data line, said data line pair transferring data signals to/from one of said normal memory cells or one of said redundant memory cells via said first and second bit lines;
a data flip circuit for selectively flipping the data signals on said first and second data lines; and
redundancy control means for controlling said data flip circuit to flip the data signals on said first and second data lines when said first normal memory cell connected to said first normal word line is replaced with said second redundant memory cell connected to said second redundant word line or when said second normal memory cell connected to said second normal word line is replaced with said first redundant memory cell connected to said first redundant word line.

17. The semiconductor memory device according to claim 16, further comprising:
sense amplifiers, each connected to a corresponding one of said bit line pairs, for amplifying the data signals on said bit line pairs; and
I/O gates for selecting one of said bit line pairs.

18. The semiconductor memory device according to claim 17, further comprising a column decoder for decoding a column address signal to control said I/O gates to select one of said bit line pairs.

19. The semiconductor memory device according to claim 16, further comprising:
a row decoder for decoding a row address signal and generating a word line selection signal;

a word line driver, responsive to a first word line driving signal from said redundancy control means, for driving said first and second normal word lines; and a redundant word line driver, responsive to a redundant word line driving signal from said redundancy control means, for driving said first and second redundant word lines.

20. The semiconductor memory device according to claim 19, wherein said redundancy control means comprises:

a master fuse latch circuit for indicating whether said first normal word line or said second normal word line has a defect and generating a master fuse signal in accordance with whether a master fuse is blown;

a fuse latch circuit for outputting a fuse latch state signal in accordance with whether a fuse is blown;

a first logic circuit for generating an address bit complementary and an address bit true when an address bit of the row address signal is supplied thereto and an inverted row address strobe signal (/RAS) is active;

a selecting circuit for selecting and outputting as an address bit signal either the address bit complementary or the address bit true in accordance with the fuse latch state signal;

a second logic circuit for generating a second word line driving signal according to the master fuse signal, the address bit signal from the selecting circuit, and at least one other address bit of the row address signal;

a third logic circuit for generating the first word line driving signal, by logically combining the second word line driving signal with other word line driving signals, each other word line driving signal corresponding to a respective bit of the row address signal; and a fourth logic circuit for generating a redundant word line driving signal responsive to the second word line driving signal and the row address strobe signal.

21. The semiconductor memory device according to claim 16, wherein said data flip circuit comprises:

a data input buffer which receives input data in response to a data flip control signal output from said redundancy control means;

a data line sense amplifier for amplifying a potential difference between said first and second data lines; and a data output buffer which outputs output data in response to the data flip control signal.

22. The semiconductor memory device according to claim 21, wherein said data input buffer flips and supplies the input data to said data line pair when the data flip control signal is active during a write operation, and said data output buffer flips an output of said data line sense amplifier when the data flip control signal is active during a read operation.

23. The semiconductor memory device according to claim 16, wherein said redundancy control means comprises:

a redundancy control circuit which receives a row address signal and outputs a normal word line driving signal, a redundant word line drive signal, and a data flip enable signal; and a data flip decoder responsive to the data flip enable signal for generating a data flip control signal, and supplying the data flip control signal to said data flip circuit to control whether the data signals on said data line pair are flipped.

24. The semiconductor memory device according to claim 16, wherein said redundancy control means comprises:

a comparing circuit for comparing an input row address and a stored defective row address, the defective row address indicating which one of said first and second redundant word lines replaces said first or second normal word lines;

determining means for determining whether said first normal word line selected by the input row address is replaced with said second redundant word line or whether said second normal word line selected by the input row address is replaced with said first redundant word line, wherein said redundancy control means outputs a redundant word line driving signal when said comparing circuit detects that the input row address and the defective row address are identical, and outputs a data flip control signal when said determining means determines that said first normal word line is replaced with said second redundant word line or when said determining means determines that said second normal word line is replaced with said first redundant word line, the data flip control signal controlling said data flip circuit to flip the data signals on said first and second data lines.

25. A semiconductor memory device with row redundancy comprising:

a plurality of first memory cells for storing true data, said first memory cells being connected to a first group of word lines;

a plurality of second memory cells for storing complementary data, said second memory cells being connected to a second group of word lines;

a first group of bit lines connected to said first and second memory cells and arranged to cross said first and second groups of word lines;

a second group of bit lines connected to said first and second memory cells and arranged to cross said first and second groups of word lines and arranged between said first group of bit lines; and a data line pair comprising a first data line connected to said first group of bit lines and a second data line connected to said second group of bit lines;

a data flip circuit inhibited from flipping bit information on said first and second data lines when said first memory cells are connected to said first and second data lines, said data flip circuit flipping the bit information on said first and second data lines when said second memory cells are connected to said first and second data lines.

26. The semiconductor memory device according to claim 25, further comprising a decoder for generating a data flip control signal to control said data flip circuit, said data flip circuit flipping the bit information on said data line pair according to the data flip control signal.

27. The semiconductor memory device according to claim 26, wherein said data flip decoder includes a logic circuit which receives the two least significant bits of a row address of said first and second memory cells and generates the data flip control signal by determining whether the two least significant bits of the row address identify said first group or said second group of word lines.

28. The semiconductor memory device according to claim 25, wherein said first and second groups of word lines include normal and redundant word lines.

29. The semiconductor memory device according to claim 25, further comprising sense amplifiers, each connected to a corresponding one of said bit lines in said first and second groups, for amplifying a potential difference between said first and second groups of bit lines.

30. A method for testing a semiconductor memory device with row redundancy, having memory cells arranged in rows and columns, the memory cells connected to bit lines and including normal memory cells and redundant memory cells wherein the normal memory cells are connected to normal word lines and the redundant memory cells are connected to redundant word lines, said method comprising the steps of:

detecting a defective memory cell in a normal memory cell array;

inhibiting a normal word line connected to said detected defective memory cell from being accessed, and replacing said defective memory cell with a redundant memory cell connected to a redundant word line;

determining whether an input row address is identical to a stored row address, the stored address indicating the normal word line connected to said defective memory cell;

determining whether data stored in a memory cell to be accessed by the input row address is identical to data stored in a replaced normal memory cell when the input row address is identical to the stored row address;

flipping data in order to write the data in said redundant memory cell when the input row address is different from the stored row address;

reading the data written in said redundant memory cell to flip the data; and determining whether the data written in said redundant memory cell is identical to the data read from said redundant memory cell, wherein if said data written in and read from said redundant memory cell is not identical then said redundant memory cell is defective.

31. A semiconductor memory device comprising:

a first word line connected to a first row of memory cells each of which stores data in a true data state;

a second word line connected to a second row of memory cells each of which stores data in a complementary data state;

a first bit line connected to a memory cell in said first row of memory cells;

a second bit line connected to a memory cell in said second row of memory cells; and data flipping means for flipping data signals supplied to/from said first and second bit lines when one of said first and second word lines replaces the other of said first and second word lines.

32. The semiconductor memory device according to claim 31, further comprising:

a third word line connected to a third row of memory cells each of which stores data in the true data state; and a fourth word line connected to a fourth row of memory cells each of which stores data in the complementary data state, wherein said first bit line is connected to a memory cell of said third row of memory cells and said second bit line is connected to a memory cell of said fourth row of memory cells, and wherein said data flipping means does not flip the data signals supplied to/from said first and second bit lines when one of said first and third word lines replaces the other of said first and third word lines or when one of the second and fourth word lines replaces the other of said second and fourth word lines.

\* \* \* \* \*